(12) United States Patent
Lanoue et al.

(10) Patent No.: US 6,630,872 B1
(45) Date of Patent: Oct. 7, 2003

(54) DIGITAL INDIRECTLY COMPENSATED CRYSTAL OSCILLATOR

(75) Inventors: Jean-Claude Lanoue, Ville St. Laurent (CA); Daniel Domey, Town of Mount Royal (CA)

(73) Assignee: CMC Electronics, Inc., Ville St. Laurent (CA)

(*) Notice: Subject to any disclaimer, the term of this patent is extended or adjusted under 35 U.S.C. 154(b) by 0 days.

(21) Appl. No.: 09/910,182

(22) Filed: Jul. 20, 2001

(51) Int. Cl.[7] .................................................. H03L 1/00
(52) U.S. Cl. ........................ 331/176; 331/158; 331/66
(58) Field of Search ............................ 331/176, 17, 18, 331/25, 158, 177 V, 66

(56) References Cited

U.S. PATENT DOCUMENTS

| | | | |
|---|---|---|---|
| 3,451,042 A | 6/1969 | Jensen et al. | |
| 4,412,188 A | * 10/1983 | Helle et al. | 331/176 |
| 4,622,667 A | 11/1986 | Yount | |
| 4,700,348 A | 10/1987 | Ise et al. | |
| 4,851,792 A | * 7/1989 | Ochiai et al. | 331/176 |
| 4,899,117 A | 2/1990 | Vig | |
| 4,930,118 A | 5/1990 | Sugihara | |
| 5,101,356 A | 3/1992 | Timothy et al. | |
| 5,195,040 A | 3/1993 | Goldsmith | |
| 5,222,245 A | 6/1993 | Ando et al. | |
| 5,323,164 A | 6/1994 | Endo | |
| 5,461,388 A | 10/1995 | Applegate et al. | |
| 5,535,278 A | 7/1996 | Cahn et al. | |
| 5,550,736 A | 8/1996 | Hay et al. | |
| 5,576,715 A | 11/1996 | Litton et al. | |
| 5,594,453 A | 1/1997 | Rodal et al. | |
| 5,608,627 A | 3/1997 | Lecomte et al. | |
| 5,615,236 A | 3/1997 | Turney | |
| 5,621,416 A | 4/1997 | Lennen | |
| 5,629,649 A | * 5/1997 | Ujiie | 331/158 |
| 5,629,708 A | 5/1997 | Rodal et al. | |
| 5,654,718 A | 8/1997 | Beason et al. | |
| 5,678,169 A | 10/1997 | Turney | |
| 5,754,757 A | 5/1998 | Shrivastava et al. | |
| 5,778,206 A | 7/1998 | Pain et al. | |
| 5,838,894 A | 11/1998 | Horst | |
| 5,838,900 A | 11/1998 | Horvath et al. | |
| 5,864,315 A | 1/1999 | Welles, II et al. | |
| 5,893,044 A | 4/1999 | King et al. | |
| 5,903,654 A | 5/1999 | Milton et al. | |
| 5,914,685 A | 6/1999 | Kozlov et al. | |
| 5,915,082 A | 6/1999 | Marshall et al. | |
| 5,923,286 A | 7/1999 | Divakaruni | |
| 5,923,287 A | 7/1999 | Lennen | |
| 5,940,027 A | 8/1999 | Forseth et al. | |
| 5,949,372 A | 9/1999 | Lennen | |
| 6,040,744 A | * 3/2000 | Sakurai et al. | 331/176 |
| 2002/0005765 A1 | * 1/2002 | Ashley et al. | 331/176 |

FOREIGN PATENT DOCUMENTS

JP     6 180357     6/1994

OTHER PUBLICATIONS

Micro–Jump Screening Station for GPS User Equipment, Larry D. Vittorini, Rockwell International, Collins Avionics & Communications Divisions, Cedar Rapids, Iowa 52498, USA, 1997 IEEE International Frequency Control Symposium, pp. 373–381.

SMD Calibrated Dual Crystal Oscillator, http://www.rakon.com/–Aug. 23, 2002, pp. 1–6.

* cited by examiner

Primary Examiner—Michael Tokar
Assistant Examiner—Lam T. Mai
(74) Attorney, Agent, or Firm—Kudirka & Jobse, LLP

(57) ABSTRACT

A temperature compensation technique is disclosed which allows to obtain a compensated clock signal. The temperature compensation technique comprises the use of a thermal model of the oscillator with a temperature sensor in order to accurately compute the oscillator frequency, irrespective of time-variations and rates.

13 Claims, 12 Drawing Sheets

FIG_1

| Hexadecimal Address | Description | Decimal byte address Comment & example |
|---|---|---|
| 000-001\h | Test patterns; start of reference data table | 0   aa\h (LSB) alternating 1/0...<br>1   55\h (MSB) patterns |
| 002\h | Interface ID | 2   set to 1 for this design |
| 003\h | VERSION NUMBER | 3   set to 1 for this version |
| 004-005\h | LAST ADDRESS used; address of the CRC MSB byte (6663 nominal)) | 4   LBS byte of byte address<br>5   MSB byte of byte address |
| 006-009\h | Calibration DATE code for unit | 6-9   1999l231= Dec. 31/1999 |
| 00a-00d\h | SERIAL number of unit | 10-13   123456789= serial 123456789 |
| 00e-011\h | CRYSTAL manufacturing lot identification | 14-17   Free format; shall be unique |
| 012-015\h | RESERVED for manufacturer usage (Reference to calibration Data files) | 18-21   Free format; undefined |
| --- | SPARES (all 0's) | 22-30 |
| 01f\h | CHECKSUM byte | 31   sum of Bytes above; using unsigned binary arithmetic |

FIG. 10A

| Hexadecimal Address | Description | Decimal byte address Comment & example |
|---|---|---|
| 020-023\h | Thermal time-constant Ttag | 32-35 +1,000,000 =1 second |
| 024-027\h | Temperature RANGE, (lower limit) | 36-39 -65E6 = -65 deg C nominal |
| 028-02bh | Temperature RANGE,(upper limit) | 40-43 +95E6= +95 deg C nominal |
| 02c-02f\h | temperature increment STEP | 44-47 +250,000= .25 deg C nominal |
| 030-033\h | Calibration OFFSET, at 22 ± 3 degrees C | 48-51 ±1,000,000=±10 Hertz |
| --- | Spares (all 0's) | 52-254 |
| 0ff\h | Spares (all 0's); end of reference data table | 255 |
| 100\h | ADC code for lowest temperature (LSB byte) | 256  base address, Tadc table |
| 101\h | ADC code for lowest temperature | 28 bits ADC data, unsigned |
| 102\h | ADC code for lowest temperature | 0000 0000\h= 0 volts (Cold) |
| 103\h | ADC code for lowest temperature (MSB byte) | 0fff ffff\h= Vref (Hot) |
| --- | .25 C increments typical | |
| --- | ADC code for highest temperature (MSB byte) | 2819  nominal; end of Tadc table |
| --- | Spares (all 0's) | 2820-4095 |

FIG. 10B

| Hexadecimal Address | Description | Decimal byte address Comment & example |
|---|---|---|
| 1000\h | dFc deviation for lowest temperature (LSB byte) | 4096  base address, dFc table |
| 1001\h | dFc deviation for lowest temperature | ±10 Hertz |
| 1002\h | dFc deviation for lowest temperature | *Actual RF output frequency =* |
| 1003\h | dFc deviation for lowest temperature (MSB byte) | *dFc + 10 (MHz)* |
| --- | .25 dg C increments typical | |
| --- | dFc deviation for highest temperature (MSB byte) | 6659  typical; end of dFc table |
| --- | CRC data (LSB byte) | CRC code word (4 bytes) |
| --- | CRC data | 32 Bits binary data |
| --- | CRC data | |
| --- | CRC data (MSB byte) | 6663  nominal; end of CRC and data |
| --- | Spares (all 0's) | 6664-8190 |
| 1fff\h | Spares (all 0's) | 8191  end of memory |

FIG. 10C

DIGITAL INDIRECTLY COMPENSATED CRYSTAL OSCILLATOR

FIELD OF THE INVENTION

This invention pertains to the field of temperature compensation. More precisely, this invention describes an indirect temperature compensation process and its embodiment in a crystal oscillator, called "Digital Indirectly Compensated Crystal Oscillator" (DICXO).

BACKGROUND OF THE INVENTION

Electronic clocks, and in particular crystal oscillator, are a key component of many electronics systems, such as electronic instrument, radio-communication device, data communication, electronic navigation devices, landing systems, etc. The clock frequency stability is in general a key parameter.

Besides time (aging), temperature variation is the most basic and the most important cause of clock frequency variation. In applications such as in avionics, the ambient temperature range is typically from −55° C. to +85° C. and the rate is up to 5 deg/min. In this environment, the typical uncompensated crystal oscillator drifts by +−50 parts-per-million, with rates up to about 3 parts-per-million/deg.

Various techniques have long been available to mitigate the temperature effects, such as the oven controlled crystal oscillator (OCXO) and the temperature compensated crystal oscillator (TCXO).

In the oven controlled crystal oscillator, the oscillator is maintained at a constant temperature in a thermally-insulated and temperature-regulated housing or oven. Unfortunately, such devices are expensive, bulky, and they need input power for the oven. Furthermore, a warming time is necessary prior working.

In the temperature compensated crystal oscillator, a temperature sensor provides feedback-control of the oscillator frequency in order to reduce the residual drift. Typically, the sensor is a hand-trimmed compensation thermistor network that feeds a "varicap" oscillator tuning diode. The precise adjustment of the control circuits requires manual iterations and is of limited accuracy. Furthermore, tuning an oscillator can compromise its inherent stability; finally, the technique does not work with some types of crystal, such as the SC-cut crystals that are electrically too "stiff" and do not yield to electrical tuning.

An improvement of the TCXO, the digital compensation crystal oscillator (DCXO) uses built-in interpolation circuits to perform the frequency correction digitally. The calibration data are saved in a built-in memory device.

Although the average frequency can be indeed very stable, digital approximations cause a large time-jitter modulation that degrades seriously the spectral phase noise purity. Therefore, the DCXO is not suitable for most RF applications.

Besides temperature compensation, there is a need for compensating the effects of the temperature variation or thermal dynamics, due to the changes in the external environment. Large temperature variation rates can cause transient thermal distortions in various devices and can degrade the accuracy of the temperature compensation in the clock.

The usual mitigation techniques comprise, the use of an OCXO, adding thermal insulation and/or regulation to dampen the variation rates, insuring a tight thermal coupling between the compensation device and the oscillator, so as to reduce the thermal distortion.

The thermal dynamics effects depend mostly upon the clock construction, but also upon its actual installation and the thermal design of the user system. Hence there can be significant variations from installation to installation, causing unexpected performance variations. The issue of the thermal dynamics and of the actual thermal environment is particularly important for airborne GPS navigation and landing systems, which are sensitive to small clock instabilities.

The thermal dynamics from the environment will induce clock frequency variations that in turn will cause apparent errors in the user system.

For instance, at the GPS L1 carrier frequency (1.57542 GHz, 0.19M wavelength), a 1 PPM clock frequency error is equivalent to a frequency error of 1.5 KHz. This is an apparent aircraft speed error of 1500*0.19=285 M/S or 554 MPH. This error will be common to all GPS satellites being tracked, so it can be estimated by the built-in computer and cancelled out. Nevertheless, this speed error shows up and stresses the individual GPS carrier-tracking loops of the system. Similarly, the temperature variations generate higher order frequency derivatives that are equivalent to an apparent acceleration error due to the second derivative (d2F/dt2), an apparent jerk (acceleration rate) error due to the third derivative (d3F/dt3). Unless properly handled, the temperature variations can cause significant stresses on the tracking loops of the GPS navigation system that will impair its performance and safety of use. Furthermore, the apparent acceleration and jerk are critical and must be strictly controlled in particular applications such as clock aiding, where the precise value of the receiver clock time is used in the navigation solution to complement the GPS satellite measurements.

SUMMARY OF THE INVENTION

It is an object of the invention to provide a compensation indirectly in the host system without altering the subject devices, their characteristics or their outputs.

It is another object of the invention to compensate the static temperature effects and the transient as well as the dynamic effect induced at the device level.

Yet another object of the invention is to compensate the static temperature effects and the transient and the dynamic effect induced in the application at the system level.

According to one aspect of the invention there is provided a method for generating an estimation of the effects of temperature on an oscillator in a Global Positioning System (GPS), the method comprising the steps of providing a thermally coupled temperature sensor coupled to the oscillator; providing a thermal model of the oscillator; measuring the oscillator frequency at a stable temperature over a range of temperature; varying the temperature and measuring the oscillator frequency over time in order to calculate the parameters of the thermal model of the oscillator; in use, measuring a temperature using at least the temperature sensor over time; calculating the estimate temperature of the oscillator using at least said thermal model of the oscillator and the temperature value over time; outputting a signal representing the oscillator signal frequency.

According to another aspect of the invention there is provided an apparatus for estimating the effects of temperature on an oscillator in a Global Positioning System (GPS), the apparatus comprising a temperature sensor, providing a temperature signal, the temperature sensor being thermally coupled to the oscillator; an analog to digital converter, receiving the temperature signal and providing a digital temperature signal; a data storage, comprising a look-up table, the look-up table comprising a relation between a temperature and a oscillator frequency; the data storage receiving the digital temperature signal and providing an oscillator frequency; wherein the look-up table is created by using a thermal model of the oscillator with the temperature signal of the temperature sensor.

BRIEF DESCRIPTION OF THE DRAWINGS

The invention will be better understood by way of the following description of the preferred embodiment, together with the accompanying drawings, in which:

FIG. 10 is a table which shows a typical DICXO data memory allocation table;

PREFERRED EMBODIMENT OF THE INVENTION

Figure 1:
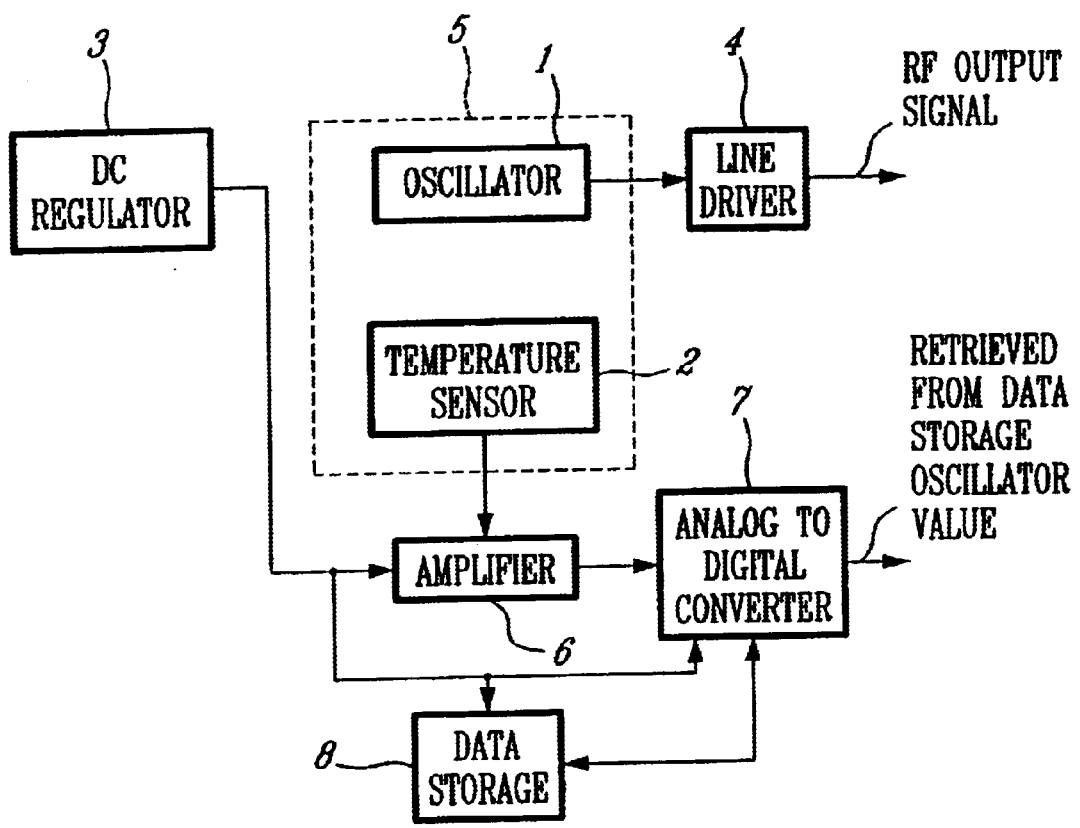
FIG. 1 is a block diagram of one embodiment of the present invention.

Now referring to FIG. 1, there is shown one block diagram of the DICXO. In this embodiment of the present invention, the DICXO is integrated on a single unit stand-alone device, built in a small metal case similar to the usual TCXO and OCXO cases. In another embodiment of the invention, an external data memory device or the main processor memory may be used. In the preferred embodiment of the invention, the temperature sensor 2 is in close thermal contact with the oscillator 1 to avoid ineffective temperature compensation.

The DC regulator 3 supplies filtered and regulated power to all functions inside the DICXO, to reduce susceptibility to external electrical noise. In the preferred embodiment, the electrical ground is isolated internally from the case. In the preferred embodiment, the case, electrical ground and RF ground will be interconnected externally by a PCB ground-plane.

The internal CMOS logic devices are powered by an external 3.3V supply in order to ensure electrical compatibility with the external logic devices. The 3.3V power supply will be feed through a small external resistor (50 ohms in the preferred embodiment) in order that a simple feed-through capacitor prevent the noise from the digital logic and processors from affecting performance.

The oscillator 1 uses in this particular embodiment a SC-cut crystal and operates on the third overtone mode, for freedom from spurious micro-jumps in frequency. The crystal is cut such as to minimize and to balance the frequency/temperature slope over the temperature range so that temperature sensitivity remains moderate.

The low-level sine wave oscillator output is buffered by the line driver 4, which outputs the required electrical signal which is, in this design, a nominal 6 dBm sine wave output with a 50 ohm source impedance. The line driver 4 provides RF isolation from load-variation effects, which is critical for an oscillator with stringent short-term stability requirement.

The oscillator temperature is sensed by a network of thermistors or Positive Temperature Coefficient resistor (PTC) referred as the temperature sensor 2. The thermal coupling 5 of the temperature sensor 2 with the oscillator 1 is made strong and both elements are well insulated from internal and external heat sources. This insures minimum distortions during temperature transients and at start-up. Ideally, the temperature sensor 2 will be attached to the crystal case of the oscillator 1, or better it will be built inside provided that this does not degrade the crystal performance. In the preferred embodiment of the invention, a special attention will be required to avoid any stresses that may develop in the mounting or in the materials used for the attachment of the temperature sensor 2 and the crystal of the oscillator 1. These stresses and their relief or variation over time and temperature may alter the temperature sensor 2's calibration, or cause non-linear thermal transient responses. The choice, quantity, and placement of materials and the fastening of the device is critical. Furthermore, in the preferred embodiment, a special attention will be taken with the use of non-linear material such as plastics, epoxy glues and silicon rubbers (RTV). Furthermore, it may be important to avoid excessive self-heating that can result in large warm-up transients. In particular, the power dissipated in the sensor network and in the crystal resonator itself should be minimized. In the preferred embodiment, the thermal paths (s) to the ambient air are controlled such as the crystal temperature lags the temperature sensor variations. This allows an estimation of the true crystal temperature for compensation of temperature variations. The process, typically implemented with a low pass filter in the application software, will smooth also the residual sensor noise, including the analog to digital converter noise.

The primary object of the strong thermal coupling between the temperature sensor 2 and the oscillator 1 is to reinforce the desired thermal paths and reduce the undesired ones.

In the preferred embodiment of the present invention, the temperature sensitivity of the temperature sensor 2 should match roughly the temperature sensitivity of the crystal of the oscillator 1, in order to ensure that the overall temperature sensitivity is reasonably uniform, to minimize the amplification of calibration errors, sensor drift and noise.

The amplifier 6 may buffer, filter and scale the raw temperature sensor 2 output in order to match it to the analog to digital converter (ADC) 7 input.

In the preferred embodiment of the invention, the analog to digital converter 7 used is a Linear Technology LTC 2400 device; in such a case, as such device has a high impedance switched-capacitor inputs, no amplifier is required between the temperature sensor 2 and the analog to digital converter 7.

Furthermore, it will be appreciated that such device enables high resolution, high linearity which enable a tight control on compensation noise and errors. Thermal phenomenon being comparatively very slow, a high conversion speed and a high sampling rate is not critical as a requirement.

The data storage 8 is in the preferred embodiment of the invention a Micro-Chip 24AA64. The data storage 8 enables the storage of calibration and compensation data. The data storage 8 is connected to the analog to digital converter 7. In the preferred embodiment of the invention, the data storage 8 includes a Cyclic Redundancy Check (CRC) code for data validation and protection.

The host system may access independently the analog to digital converter (ADC) 7 and the data storage 8 using industry standard serial data interfaces. The logic circuits use standard CMOS levels and are powered using a 3.3V power supply as explained above. The noise from the internal logic activity and power supply noise is minimized by internal de-coupling and suitable layout design. In the preferred embodiment of the invention, the "write" function of the data storage 8 is intended for factory use only. In operation, the DICXO data storage 8 will be read once and stored in the main system memory during system manufacture and the temperature sensor/analog to digital converter data will be read every 0.2s. Simple means are provided to prevent the accidental erasure of memory data in normal operation. A data code in the memory identifies the particular data protocol, format and interpolation techniques used by the unit. This will ensure compatibility with alternate sources and with future product improvements.

The DICXO Indirect Temperature Compensation Process

The DICXO indirect temperature compensation process is necessary in order to remove indirectly all direct and induced temperature effects at the device level and at the system level.

The object of the estimation process is to ensure that the estimated clock-frequency is identical to the true DICXO frequency at any time, including during temperature-variations.

Figure 2:
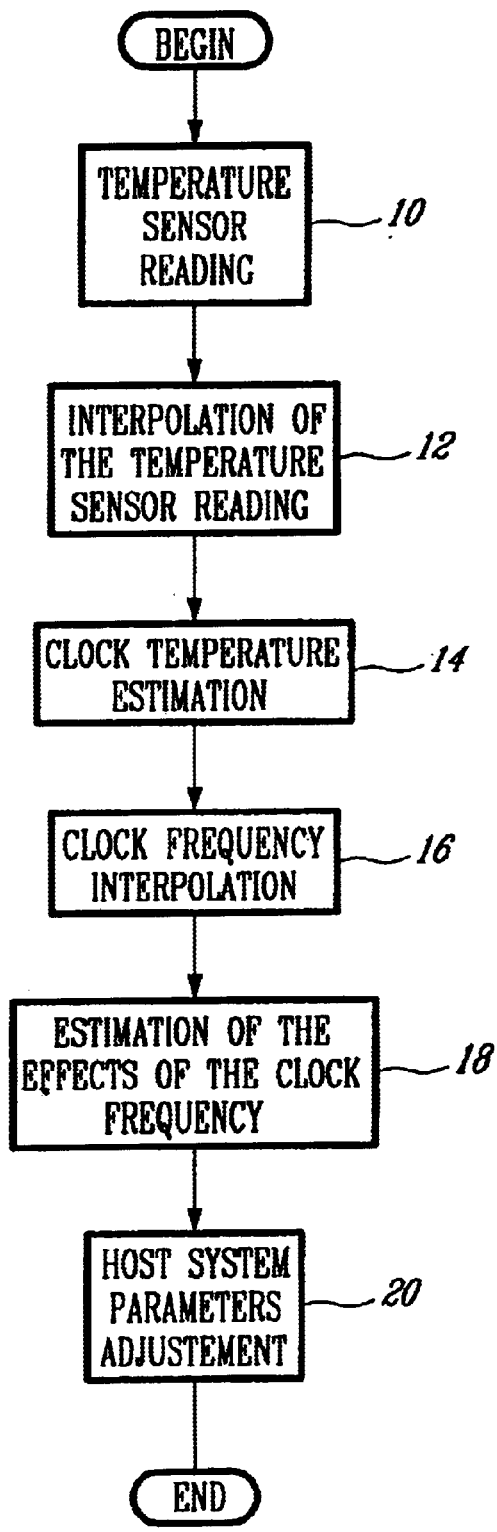
FIG. 2 is a flow chart which shows the indirect temperature compensation process.

Now referring to FIG. 2, there is shown the steps to complete in order to perform the indirect temperature compensation process.

According to step 10 of FIG. 2, the temperature sensor 2 is read at a constant rate.

According to step 12 of FIG. 2, the temperature sensor result is interpolated using sensor calibration data.

According to step 14 of FIG. 2, the clock temperature is estimated from the sensor temperature using a thermal model of the DICXO and the thermal parameters for this thermal model.

According to step 16 of FIG. 2, the clock frequency is interpolated form the clock temperature by using clock calibration data.

The thermal lags due to temperature variations are compensated by modeling, by means of a software model in the GPS receiver processor, the thermal inertia of the DICXO sensor and clock oscillator with respect to the ambient temperature changes. This feature can hardly be implemented with usual analog compensation techniques, that practically restricts themselves in reducing thermal lags.

It will be appreciated that the topology and the complexity of the thermal model is a design choice, function of the acceptable errors as well as the thermal design and construction of the DICXO.

Figure 3:
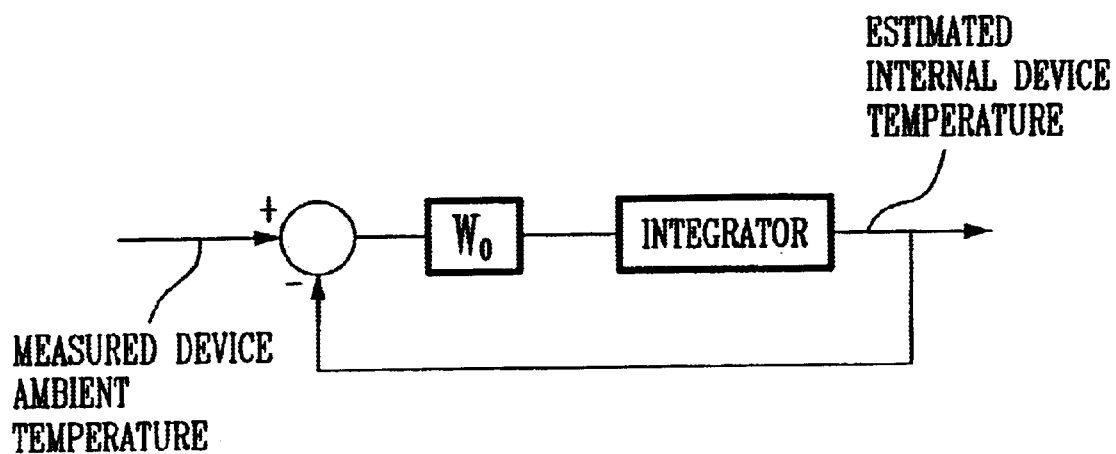
FIG. 3 is a block diagram which shows the DICXO thermal model.

The simplest thermal model is a first order, low-pass filter, as shown in FIG. 3.

Now referring back to FIG. 2 and according to step 18, an estimation is performed of the effects of the clock-frequency and their change versus time and temperature.

According to step 20 of FIG. 2, the host system parameters are adjusted in order to remove the estimated effects. In the preferred embodiment of the invention, this step is performed by removing the clock frequency errors by re-tuning the hardware numerically controlled oscillators (NCO) and RF synthesizers devices in the RF receiver channels, removing the time-drift of the DICXO by adjusting the hardware timing devices and counters that control the receiver timing; in particular the 1-second GPS timing epoch pulse and the 0.1 second measurement timing gate, and removing the clock-frequency derivatives by correcting and adjusting the internal software parameters of receiver time, time-rate, speed, acceleration, and jerk. These parameters are used in the GPS tracking loops, satellite search and coarse-acquisition processes.

The Thermal Model Initialization

The issue of properly initializing the thermal filter model has to be solved, as prior to system power-up, the DICXO cannot build up on a knowledge of the past history to set precisely the initial device temperature, even through the present temperature can be read accurately.

In a standard TCXO, this issue is not a problem as the internal sensor keeps tracking the crystal temperature at all times, including power-off.

However, this issue might be critical under fast temperature variation conditions if the system has to be ready to operate with minimum delays. A trivial solution is to use initially the sensor temperature estimate as the clock temperature estimate. This simple strategy assumes essentially that no temperature variation is underway. Unfortunately, this solution will not work in the current GPS receiver applications.

In the preferred embodiment of the invention, the strategy used assumes that the temperature variation rate was constant, so that a steady-state dynamic condition with a steady temperature lag was reached, that is an estimation of the sensor temperature rate based on two measurements spaced over a few seconds, $T_{A1}$, $T_{A2}$ over a time period $T_1$, $T_2$. A computation of the current variation rate $R=(T_{A2}-T_{A1})/(T_2-T_1)$; and finally, the initialization of the filter output with $(T_{A2}-R \cdot T_0)$, where $T_0$ is the thermal filter model time-constant.

The DICXO Calibration Process

In the preferred embodiment of the present invention, the DICXO calibration process is performed once at the factory. However, in another embodiment of the invention, it may be advantageous to update the DICXO calibration data during operation or on a regular basis, using for example real-time measurements of GPS time and frequency.

Figure 4:
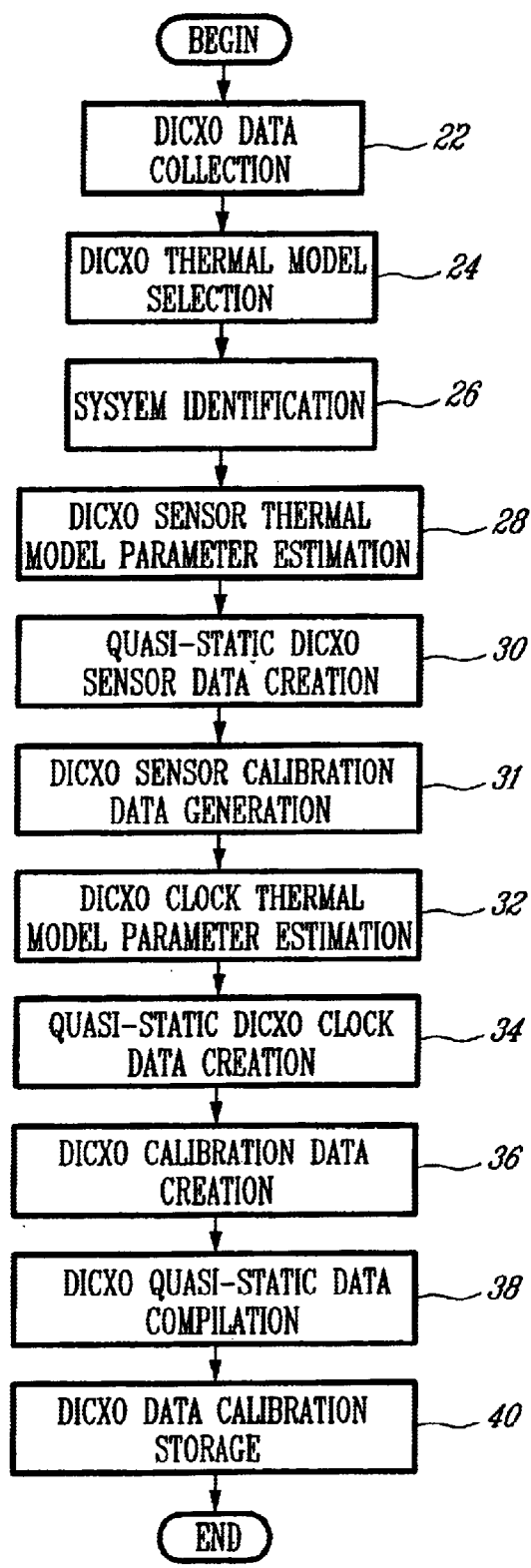
FIG. 4 is a flow chart which shows the DICXO calibration process.

Now referring to FIG. 4, there is shown the major calibration process steps. In the preferred embodiment of the present invention, Matlab is used to provide numerical analysis.

Figure 5:
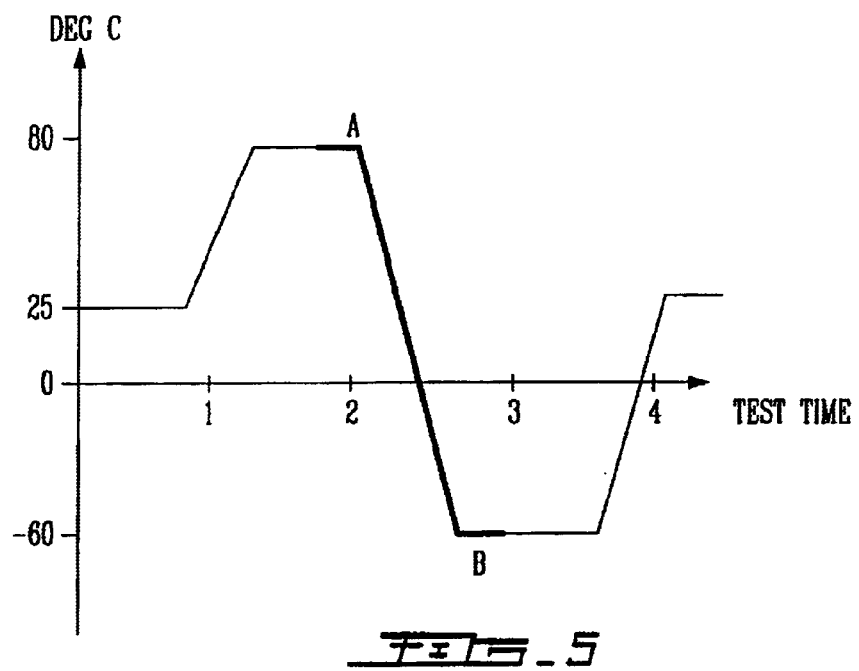
FIG. 5 is a graph which shows a typical DICXO calibration test run.

According to step 22 of FIG. 4, the DICXO test data are collected. The clock test data is first collected to describe the effects of temperature on the clock. In the preferred embodiment of the invention, each sample is collected by ramping back and forth from the lower to the upper temperature limit at nominally uniform rates. FIG. 5 shows one example of such ramping. The actual DICXO clock frequency, its temperature sensor reading and the ambient temperature read by an external LM-76 reference thermometer are recorded with a common time-tag, 5 times per second during 4 hours in the preferred embodiment of the present invention. In order to obtain the best accuracy, the thermal environment of the devices must be tightly controlled. The reference environment chosen for the particular DICXO embodiment herein assumes an isothermal still-air ambient, representative of contemporary avionics installations. It will be noted that forced air or liquid nitrogen devices commonly used to speed up cooling or heating can be harmful to the thermal response and to the calibration of the DICXO. The result of the data collecting must be smoothed and compressed in order to fit in the memory. This operation will be detailed below.

Now referring to FIG. 5, the user must select the most suitable calibration segment for an accurate and noise-free DICXO calibration. In the preferred embodiment of the present invention, the calibration segment should be monotonic and cover the temperature range required for the DICXO operations. A monotonic calibration segment will simplify the estimation process and avoid the noise that can be caused by multiple data ambiguities and not-so-coherent test data: for example two samples taken at the same temperature on remote data segments with different rates and polarities will yield likely quite different frequencies, while the frequencies will be very similar if taken from consecutive data points.

The multiple data ambiguities in the quasi-static data will be prevented inherently by the use of a calibration segment (A-B in FIG. 5), plus a temperature variation test rate (~2° C./minute) and calibration data table steps (~¼° C.) that are chosen large enough.

According to step 24 of FIG. 4, the DICXO thermal model is selected.

The DICXO and its environment create a complex 3-dimension maze of distributed and cross-coupled thermal capacities, thermal impedances, and heat sources.

Figure 6:
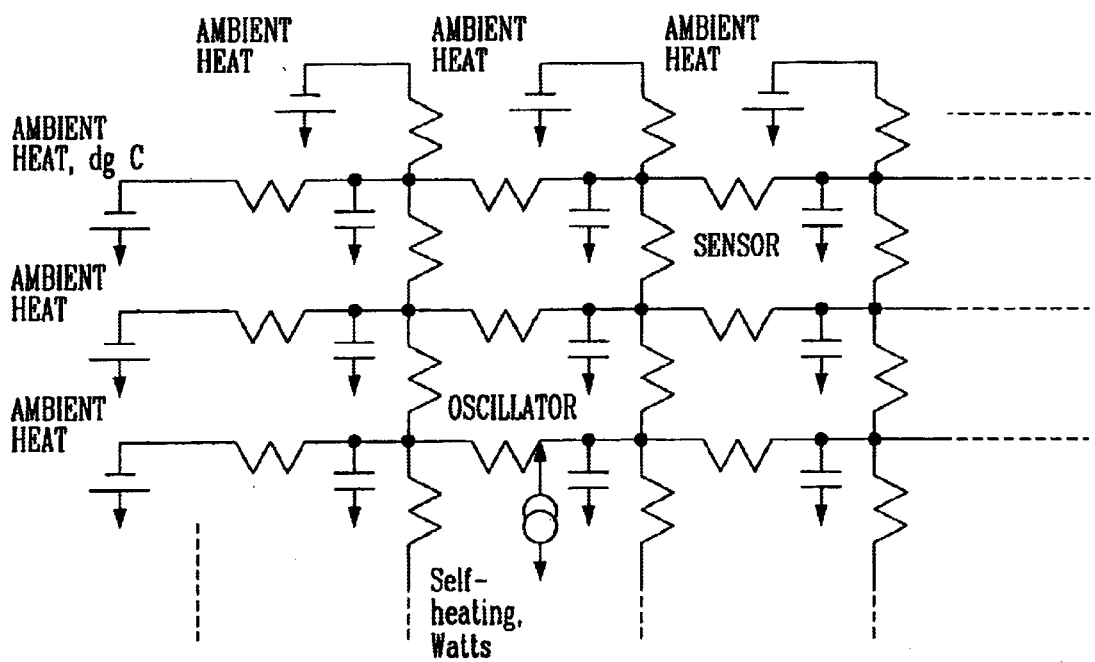
FIG. 6 is a schematic which shows a typical thermal model of the system.

Such thermal system may be analyzed using an equivalent linear electrical network of resistors, capacitors, heat sources and heat sinks. Now referring to FIG. 6, there is an equivalent of a DICXO thermal system.

In general, some elements of the network will be non-linear or time/temperature dependant, due for example to aging, heat radiation, sliding mechanical contacts and frictions, hysteresis effects, materials phase-change. The actual elements will vary with the internal DICXO construction, its actual installation and cooling in the host system. Hence there must be some spread from unit-to-unit and amongst installations. This spread may be corrected by individual calibration of the thermal model parameters. This is a form of software "tuning". For DICXO frequency-compensation purposes, the objective is to estimate the crystal temperature from which its true frequency can be estimated in real-time. It is possible to simplify the theoretical 3-dimension thermal network maze illustrated FIG. 6, by lumping together many thermal paths. This simplification is an approximation which will create therefore model approximation errors.

Figure 7:
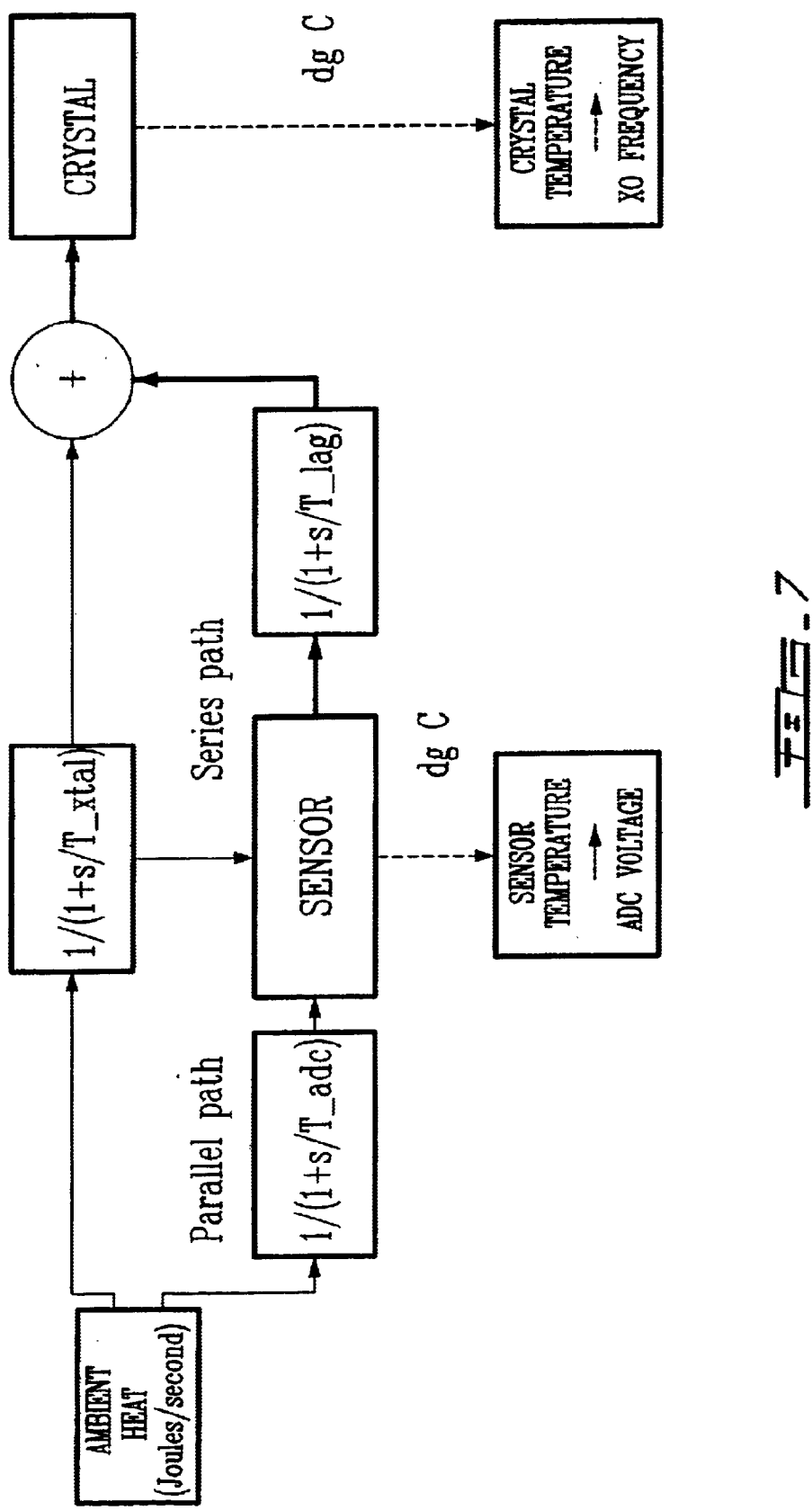
FIG. 7 is a schematic which shows a simplified thermal model of the system.

According to FIG. 7, a simplified equivalent model is shown which illustrates the two basic types of thermal coupling between external ambient air, sensor temperature, and oscillator temperature: parallel paths and serial paths. "RC" (single-pole low-pass) transfer functions approximate thermal lags.

The parallel path is made weak by construction and may be negligible compared to the serial path component. Thus the crystal temperature lags the sensor temperature. The serial path component is therefore used.

There are obviously internal and external sources of heat that are not shown in the simplified model for clarity. The internal and external sources of heat will distort momentarily the chosen model and the accuracy of temperature compensation during the first few minutes of warm-up and following a short power interruption, until the internal steady-state temperature distribution is established. Modeling self-heating would require measuring and controlling more model parameters. But as self-heating effects are comparatively small they can be ignored. The thermal model is implicitly "tuning" the DICXO to meet the specifications.

Balance must be maintained between performance, cost and complexity of this process. Obviously, the simpler the selected model is, the easier it is to calibrate, control, and implement in the host system software. Referring to FIG. 7, the serial path model is more desirable because it is easier to use. A single parameter must be modeled, $T_{lag}$. The parallel path model is less desirable, because more complex, as two parameters must be modeled, $T_{adc}$ and $T_{xtal}$. As shown in FIG. 7, the crystal temperature may lag or may lead the sensor temperature, depending upon the internal DICXO construction and the balance of thermal paths. The parameters $T_{lag}$ and $T_{adc}$ may be estimated from the observed thermal lags during tests at constant temperature variation rates. A "thermal lead" for the crystal response is undesirable and will yield a high-pass filter model that will amplify the analog to digital converter and the temperature sensor noise. Within reasonable limits, a "thermal lag" crystal response is desirable, it will yield a low-pass filter model that will smooth-out the analog to digital converter and the temperature sensor noise. Of course, an excessive lag would degrade the warm-up time.

Self-heating effects and parasitic serial/parallel paths will exist in practice, whatever the thermal model complexity. They must be minimized by design and by construction in order to avoid a degradation of the performance.

Each DICXO sample will be slightly different and must be calibrated or tuned individually by measuring its model parameters (thermal lags), typically during a temperature-ramp test. As illustrated earlier, the actual installation and cooling of a DICXO in the host system will affect and "de-tune" its thermal model. This in turn can degrade significantly the performance.

It will be appreciated, by the person skilled in the Art, that the more complex the thermal model is, the more parameters must be estimated and the more vulnerable they will be to thermal "parasitics", small experimental disturbances and inaccuracies. Furthermore, more experimental data will be necessary, hence longer test time. The system-identification process will tend to be more complex, longer and possibly unstable.

According to step 26 of FIG. 4, the DICXO system-identification technique is performed. In the preferred embodiment of the present invention, the system-identification technique used for calibrating the DICXO is based on a Lissajous plot of the thermal response. A Lissajous figure is a plot of two related time-variables, i.e. the output of a filter versus its input for a given sine-wave input, or the clock-frequency versus the sensor temperature, for calibrating the DICXO clock frequency; or the estimated sensor temperature versus the ambient temperature, for calibrating the DICXO temperature sensor.

Figure 8:
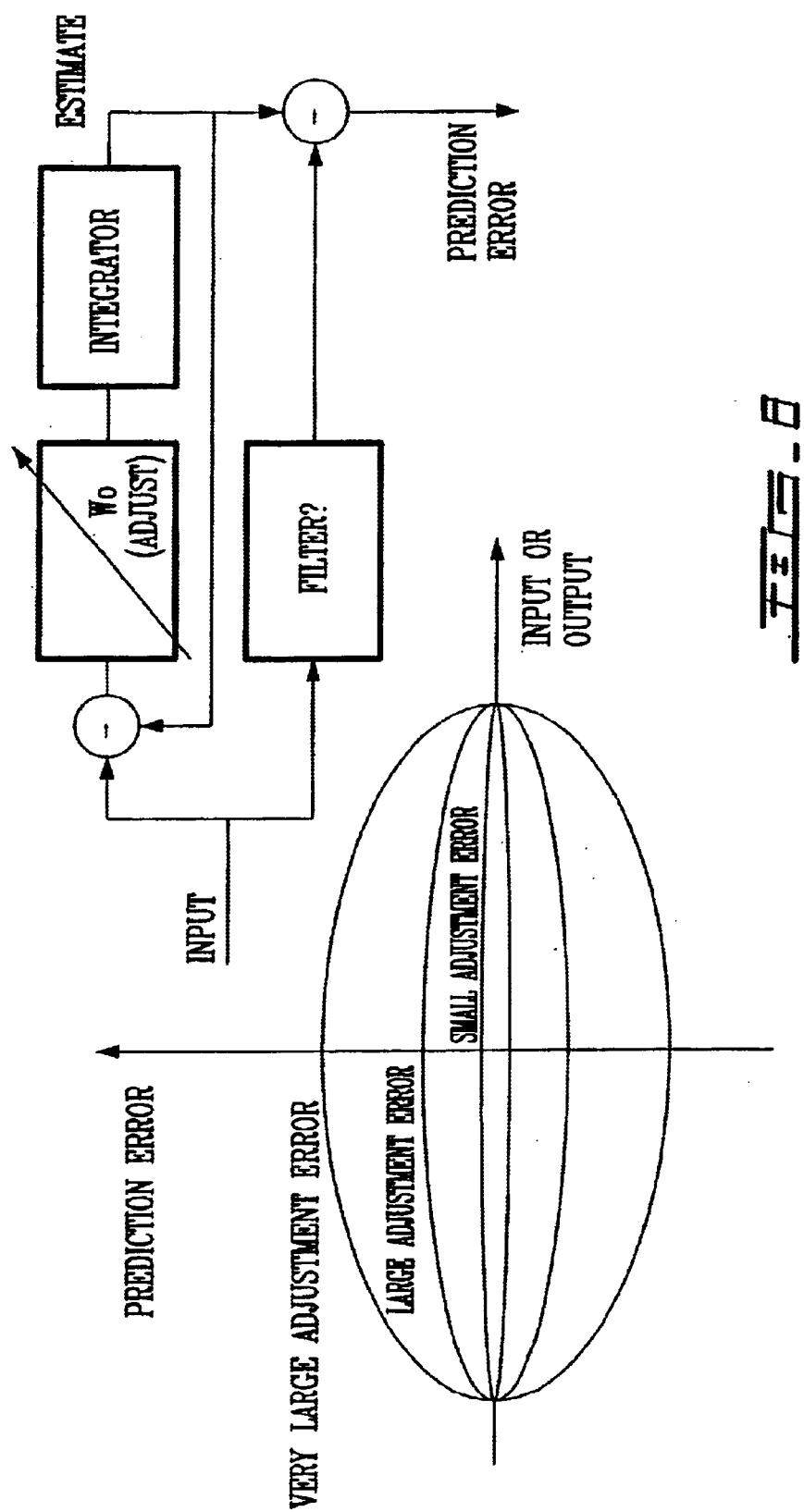
FIG. 8 is a graph which shows the thermal filter model adjustment using a Lissajous figure.

Now referring to FIG. 8, there is shown a Lissajous plot. In theory, an ellipse appears when there is a phase error in a Lissajous figure; while an horizontal straight line appears when the phase error is null.

If the thermal model time constant To is set too large, the estimate will lag the true output; the error trajectory will follow the lower-half of the ellipse when warming-up (reading too low); then it will retrace on the upper-half of the ellipse when cooling down (reading too high). The error trajectory will rotate counter-clockwise with each temperature cycle. If To is set too small, the true output will lag the estimate and the pattern of rotation will be reversed. If To is set just right, there will be no lag and the error trajectory will retrace on itself along a straight line.

Hence it suffices to adjust the thermal model (The $W_0$ parameter) until the area of the Lissajous figure is minimized. This iterative process is easy to automate and is used for the two thermal model filters of the DICXO. In practice, the ellipse is distorted because of the non-linear response of the crystal of the oscillator and the temperature sensor; because of start-up transients and micro-jumps; because the excitation is a saw-tooth rather than a sine-wave, etc. The process illustrated in FIG. 9 assumes implicitly that the design and the construction of the device(s) are such that the first-order thermal response predominates, and that all other thermal "parasitics" are made small enough. Otherwise, more than one parameter would need adjustment.

The same Lissajous figure technique may be used for a complex thermal model, but the processing will be more involved and more sensitive to small discrepancies. The process may not converge or may become unstable. In all cases, it may be possible to use the more sophisticated "system-identification" techniques known by someone skilled in the Art.

According to step 28 of FIG. 4, the DICXO sensor thermal model parameters are estimated. In the preferred embodiment of the present invention, this thermal model relates the temperature of the DICXO sensor with the external ambient air temperature and time. This step and calibrating the temperature sensor unit-by-unit as per step 30 of FIG. 4 may be dispensed with, if its accuracy and linearity are adequate for the intended use.

The sensor calibration data, do not exist yet. Thus, they are replaced temporarily by the following set of data corresponding only to the calibration data segment shown in FIG. 5: the output from the temperature sensor which is mapped time-sample-by-time-sample to the sensor-temperature estimated from the measured output of the reference thermometer, using the thermal model and a trial value of the parameter of the thermal model ($W_0$). This temporary set of data is smoothed and decimated over 2° C. windows to speed-up processing. Then it is formatted as a temporary "sensor look-up table", that relates tentatively the DICXO sensor output to its static temperature. This can be seen as a boot-strapping process, that progressively will refine itself until errors are found small enough. The prediction error is computed using all of the clock-test data as follows; first, an estimation of the sensor-temperature is performed from the output of the reference thermometer using the thermal model and the same trial value of the parameter of the thermal model ($W_0$ in FIGS. 3 and 8); then an estimation of the sensor-temperature from the output of the temperature sensor is performed by interpolating in the temporary sensor look-up table. The estimation of the prediction error is computed as the difference of the two last values computed above, in degrees Celsius.

The Lissajous figure is then displayed using the prediction error computed above and the sensor-temperature. The residual errors are estimated, either visually by eyeballing, or by computing automatically the area enclosed by the Lissajous figure.

Finally, a decision is made of increasing or decreasing the parameter of the thermal model, and the process is repeated until the residual errors are judged small enough; for example until the iteration step on $T_0=1/W_0$ is less than 1 second. The typical value of To for the DICXO sensor thermal model is of the order of 2 minutes.

According to step 30 of FIG. 4, the quasi-static DICXO sensor data are created. At the completion of the sensor thermal model estimation process above, the estimated sensor-temperature is mapped time-sample-by-time-sample to the measured output of the temperature sensor, using only the data that is part of the calibration segment A-B of FIG. 5 and the best estimate of the parameter of the thermal model of the thermal sensor.

That is, the calibration segment A-B provides directly the data used for DICXO sensor calibration.

This data set forms the quasi-static DICXO sensor data. It relates the sensor output with its temperature, as it would have been measured by sweeping at an infinitely slow rate the DICXO over the temperature range.

In the preferred embodiment of the present invention, the range of DICXO temperature calibration is extended from the actual test range up to −65° C. . . . +95° C. "Abnormal Operation" limit, by means of local interpolation polynomials. The accuracy of this extrapolated data is of course degraded. The interpolation process is identical to the one described later for the DICXO clock calibration data.

The purpose of the extrapolation is to ensure that the indirect compensation process will yield artificial but usable data, rather than creating a program failure because mathematical solutions are not possible. A program failure is potentially dangerous for the intended avionics applications.

According to step 31 of FIG. 4, the DICXO sensor calibration data are created by compiling the quasi-static sensor data. In the preferred embodiment of the invention, the DICXO sensor calibration data format and processing is identical to the DICXO clock calibration data format and processing that will be described later.

The object of this step is to smooth, compress and convert the quasi-static sensor data into a suitable form for read-back by the indirect-compensation process. In the particular DICXO embodiment herein, the quasi-static DICXO sensor data are smoothed and decimated to create a ~600 entries look-up table, using ¼° C. steps. The table format is designed for linear interpolation. The multiple-data ambiguities are prevented inherently by the use of data from the calibration segment A-B of FIG. 5 plus a temperature variation test rate and table steps that are chosen large enough. This look-up table forms the DICXO sensor-calibration data.

In the preferred embodiment of the present invention, this table will no longer be modified or re-processed, in order to ensure the coherency with the clock-calibration data that will be created in the next step. In the preferred embodiment of the present invention, the sensor-temperature reads in ° C., with a typical static accuracy of +−2° C.

According to step 32 of FIG. 4, the DICXO clock thermal model parameter is estimated. In the preferred embodiment of the present invention, this thermal model relates the temperature of the clock oscillator with the temperature of the DICXO sensor and with time. As explained earlier, this particular model assumes essentially that heat follows a series path, from the ambient air trough the sensor and finally to the clock oscillator.

The device calibration data do not exist yet. Thus, they are replaced temporarily by the following set of data corresponding only to the calibration data segment A-B of FIG. 5: the clock-temperature, estimated from the sensor-temperature using the thermal model of the device and a trial value of the parameter of the thermal model of the device ($W_0$ in FIGS. 3 and 8). It is mapped time-sample-by time sample to the measured clock-frequency.

Figure 9:
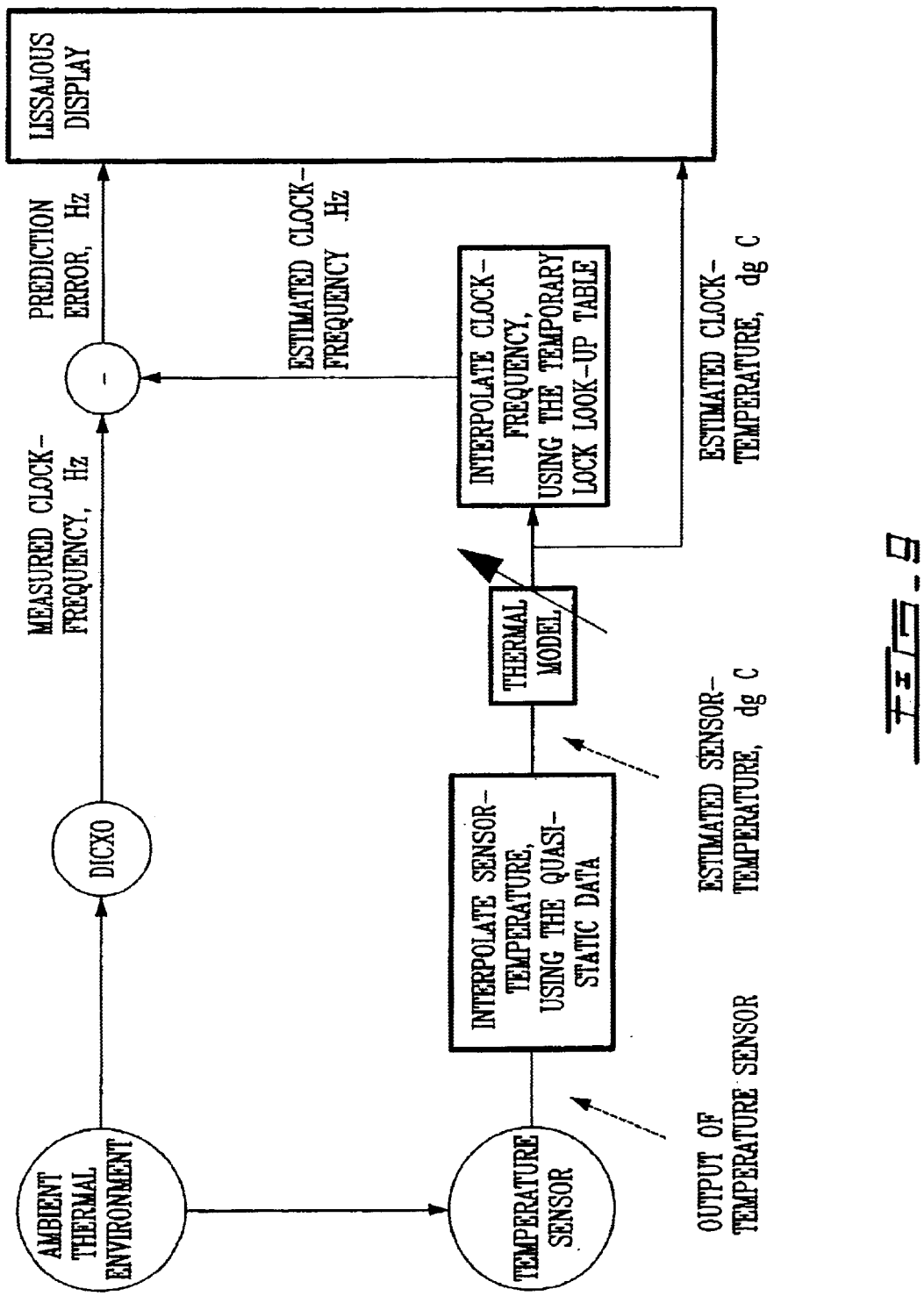
FIG. 9 is a block diagram which shows the DICXO clock calibration process.

As shown in FIG. 9, the sensor-temperature is computed from the measured outputs of the temperature sensor, by interpolating in the quasi-static sensor data that has been created in step 30.

The previous data set is then smoothed and decimated over 2° C. windows in order to speed-up processing. Then it is formatted as a temporary "clock look-up table", that relates tentatively the DICXO clock frequency to its static temperature. This can be seen as a boot-strapping process, that progressively will refine itself until errors are found small enough. The prediction error is computed as follows, using all of the clock-test data; an estimation of the clock-temperature from the sensor-temperatures is computed using the thermal model of the device and the same trial value of the parameter of the thermal model of the device ($W_0$ in FIGS. 3, 8); then an estimation of the clock-frequency is computed from the clock-temperature, by interpolating from the temporary clock look-up table; this is the first step; then in a second step, an extraction of the corresponding samples of measured clock-frequency from the clock-test data is performed. The prediction error is estimated by computing the difference between the two last computed values in the two last steps, in Hertz.

The Lissajous figure is then displayed using the prediction error computed above and the clock-temperature. The residual errors are estimated, either visually by eyeballing, or by computing automatically the area enclosed by the Lissajous figure.

Finally, a decision is made of increasing or decreasing the parameter of the thermal model of the device, and the process is repeated until the residual errors are judged small enough; for example until the iteration step on $T_0=1/W_0$ is less than ⅛seconds. The typical value of $T_0$ for the clock thermal model is of the order of 20 seconds.

According to step 34 of FIG. 4, the quasi-static DICXO clock data are created.

At the completion of the clock thermal model estimation process above, the estimated clock-temperature is mapped time-sample-by-time-sample to the measured clock frequency, using only the data that are part of the calibration segment A-B of FIG. 5 and the best estimate of the parameter of the thermal model of the device.

That is, the calibration segment A-B provides directly the data used for DICXO clock calibration.

This data set forms the quasi-static DICXO clock data. It relates the clock frequency with its internal temperature, as it would have been measured by sweeping at an infinitely low rate the DICXO over the temperature range.

According to step 36 of FIG. 4, the DICXO clock calibration data are created. The object is to format and save the quasi-static DICXO clock data in the data-storage element, in a format suitable for writing and reading-back the calibration data and the parameter of the thermal model.

As explained above, the DICXO sensor data have been created first in order to insure of coherency with the DICXO clock-calibration data. Only the quasi-static DICXO clock data remains to compile.

The multiple-data ambiguities are prevented inherently by the use of the calibration segment A-B, plus a temperature variation test rate and table steps that are chosen large enough.

In the preferred embodiment of the present invention, the range of DICXO temperature calibration is extended from the actual test range up to −65° C. . . . +95° C. "Abnormal Operation" limit, by means of local interpolation polynomials. The accuracy of this extrapolated data is of course degraded.

The purpose of the extrapolation is to ensure that the indirect compensation process will yield artificial but usable data, rather than creating a program failure because mathematical solutions are not possible. A program failure is potentially dangerous for the intended avionics applications.

In addition, calibration tools include ancillary validation tests and sanity checks, such as the verification of the monotonicity of the sensor-calibration data, the noise on the calibration data and its derivatives, the range of temperature calibration, the record of process data such as the operator name and file names, the record of the software tools revision level.

The Interpolation

The most obvious prior Art techniques for interpolating the calibration data are time-window smoothing and decimation of the raw data by means of a digital FIR filter, followed by polynomial curve-fitting interpolation, or look-up table interpolation. The time-window smoothing and decimation are easy to implement, and will yield directly to look-up tables suitable for interpolation. Furthermore, the smoothing reduces the noises and eliminates the small multiple-data ambiguities. The major drawback is the large size of the look-up table if interpolation errors are to be kept very small. Another drawback is that no interpolation is possible beyond the table limits.

In the preferred embodiment of the invention, the look-up table interpolation technique is selected for the DICXO.

However, polynomial interpolations have been used or are used for estimating the thermal model parameters, and for extrapolating the calibration data beyond the actual test range as described previously.

According to step 38 of FIG. 4, the quasi-static data of the DICXO are compiled from the quasi-static clock data. The object of this step is to smooth, compress and convert the quasi-static data into a form suitable for read-back by the indirect-compensation process.

In the preferred DICXO embodiment herein, both the quasi-static clock data and the quasi-static sensor data are smoothed and decimated to create large (~600 entries) calibration look-up tables with ¼° C. steps. The table formats are identical and designed for linear interpolation. The look-up table created from the quasi-static clock data using this compilation process forms the DICXO clock-calibration data. The look-up table created from the quasi-static sensor data using this compilation process forms the DICXO sensor-calibration data, as described earlier.

According to step 40 of FIG. 4, both the DICXO clock and DICXO sensor calibration data are stored in the data storage together the parameters of the thermal models, and the ancillary data which is useful for operation, incoming inspection tests, maintenance, and Quality Control purposes. For example, in the DICXO embodiment, the ancillary data comprise parity and CRC codes, manufacturer name and code, date codes, lot and serial numbers, data files names and revision numbers, process data (Operator ID, software tools & revision, etc.), interface data (variants, options, alternate suppliers, etc.), alternative topologies of the thermal model, data about the look-up tables structure, etc. These data are formatted to fit physically and logically in the selected data-storage device, a CMOS 64 KB EEPROM, so that it may be written and read. The actual DICXO data format in the EEPROM integrated-circuit is illustrated FIG. 10. In the preferred embodiment of the invention, the "dFc" table holds the clock-calibration data and the "ADC"table holds the temperature sensor-calibration data using both 32 bits data words.

The De-tuning

Figure 11:
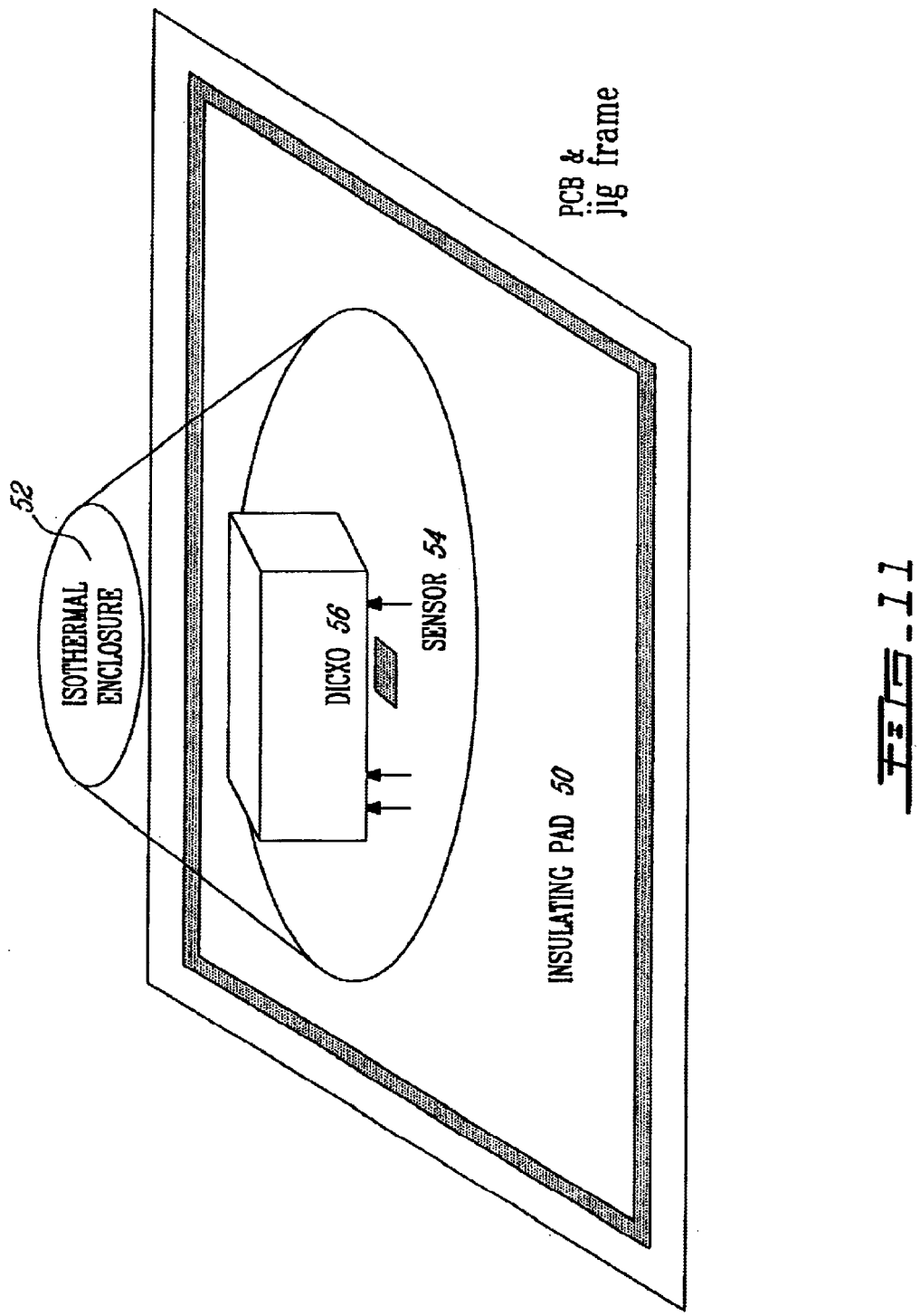
FIG. 11 is diagram which shows the set up for DICXO thermal test conditions

The de-tuning may be severe in a forced-air cooling system, or if there are large local heat sources such as processors, interfaces, power amplifiers, etc since the DICXO is typically calibrated in the isothermal still-air ambient defined in FIG. 11. Whether or not the DICXO de-tuning is significant depends upon both the intended application and the actual installation.

The conventional design solutions are adding thermal insulation and/or thermal regulation. These techniques require of course extra physical space, material, power and weight. Hence, they may not be applicable. To limit the de-tuning effects, the standard DICXO test set-up assumes a nominal value of the system thermal time-constant of typically 8 minutes. Hence the end-user should design the host system and its cooling for a system-level thermal lag greater than 8 minutes, in order to avoid a degradation of the performance of the DICXO beyond the specification limits.

Because of the thermal de-tuning effects, the DICXO performance must be measured in a standardized and optimized test environment. Otherwise the tests will no longer characterize the DICXO performance properly, but its thermal environment. FIG. 11 defines an idealized "isothermal still-air ambient" test environment. It is intended to be easily reproducible, and representative of the convection & conduction-cooled installation typical of contemporary avionics.

Still referring to FIG. 11, the insulating pad 50 is a ½" thick rigid fiber-glass panel overlaid on or under the PCB, blocking heat and airflow from under. It is important to remove any metal foil exposed under the isothermal exposure 52. Sockets protrude for plugging the DICXO and the sensor.

The temperature sensor 54 is raised ¼" over the pad and ¼" under the DICXO 56 base. The LM76 digital thermometer integrated circuit in a SO-8 package, mounted via long fine leads and calibrated within +−¼ C. of an NBS-traceable standard.

The isothermal enclosure 52 is a Styrofoam coffee cup cut-down to 1.5". it provides the reference isothermal still-air ambient for the DICXO 56.

The heat spreader (Not shown) is an heavy cast aluminum box 2H*3W*5D" ⅛" thick, loosely resting on the pad and covering the isothermal enclosure. It reduces temperature gradients and air draft effects.

The DICXO 56 is mounted in a nominally horizontal position; it is standing in free air in the isothermal enclosure, clearing the sensor, the enclosure walls, and the pad.

In the preferred embodiment of the invention, the system thermal lag is normalized to 8 minutes, measured from the test chamber control point to the DICXO temperature sensor 54. This is because the thermal inertia can hardly be controlled at all three sensors. In the preferred embodiment, the test chamber is chosen, then the isothermal enclosure(s) is selected and heat spreader(s) in order to obtain this condition.

It may be important to use a sturdy construction and stable thermal paths in order to improve repeatability and to reduce hysteresis errors. Materials that are stable over the test temperature range must be chosen. ESD must be controlled when using insulating materials.

Thermal lags may be estimated from the actual temperature lags during temperature test ramps, or from the Lissajous plot of output versus input temperature during temperature test cycles.

What is claimed is:

1. An estimation generator of the effects of temperature on an oscillator in a GPS receiver system, the estimation generator comprising: a temperature sensor thermally coupled to said oscillator, said temperature sensor outputting a temperature signal; a memory storing data characterizing oscillator frequency as a function of said temperature signal and time according to a thermal model; a calculator receiving said temperature signal over time for estimating oscillator frequency using said thermal model and said data.

2. The estimation generator as claimed in claim 1 wherein said data comprises a plurality of look-up table and said calculator derives said estimate from said plurality of look-up table.

3. The estimation generator as claimed in claim 1, wherein said thermal model is a first order model.

4. The estimation generator as claimed in claim 2, wherein one of said plurality of look-up table relates said temperature signal to the sensor temperature, one of said plurality of look-up table relates said oscillator frequency to oscillator temperature; and the thermal model relates said oscillator temperature to said sensor temperature and to ambient temperature over time.

5. A method for generating an estimation of the effects of temperature on an oscillator in a GPS receiver system, the method comprising the steps of:
   (a) varying temperature and measuring oscillator frequency and temperature over time for calibrating the oscillator frequency as a function of the temperature over time according to a thermal model;
   (b) in use, estimating the oscillator frequency using said thermal model, said calibration data and said temperature over time.

6. The method as claimed in claim 5, wherein calibrating the oscillator frequency comprises the steps of:
   (a) varying the temperature and measuring temperature and oscillator frequency over time;
   (b) calculating estimates of the oscillator temperature from temperature measurements over time using the thermal model;
   (c) calculating estimates of the oscillator frequency from oscillator temperature estimates;
   (d) observing errors between the oscillator frequency estimates and the oscillator frequency measurements;
   (e) adjusting the parameters of the thermal model such as to reduce the errors, until said errors are acceptable; thereby calibrating the thermal model;
   (f) calibrating the oscillator frequency as a function of the estimated oscillator temperature using the oscillator frequency measurements; thereby removing the effect of time variations and rates.

7. The method as claimed in claim 6, wherein the step of observing errors is performed by displaying the error versus a temperature estimate using a Lissajous plot, and estimating the size of the Lissajous pattern on the Lissajous plot.

8. The method as claimed in claim 5, further comprising the step of calibrating said temperature sensor as a function of ambient temperature.

9. The method as claimed in claim 8, wherein calibrating said temperature sensor is performed according to a thermal model of the temperature sensor and the ambient temperature.

10. The method as claimed in claim 9, wherein calibrating the temperature sensor comprises the steps of:
   (a) varying the ambient temperature and measuring temperature and ambient temperature over time;
   (b) calculating estimates of sensor temperature from the ambient temperature measurements over time using the thermal model of the temperature sensor;
   (c) calculating estimates of the sensor temperature from the temperature measurements;
   (d) observing errors between the estimates of the sensor temperature from the ambient temperature measurements, and the estimates of the sensor temperature from the temperature measurements;

(e) adjusting the parameters of the thermal model of the temperature sensor in order to reduce the errors, until said errors are acceptable; thereby calibrating the thermal model;

(f) calibrating the temperature as a function of the estimated sensor temperature using the temperature measurements; thereby removing the effect of time variations and rates.

11. The method as claimed in claim 10, wherein the step of observing errors is performed by displaying the error versus a temperature estimate using a Lissajous plot, and estimating the size of the Lissajous pattern on the Lissajous plot.

12. The method as claimed in claim 9, wherein calibrating the oscillator frequency as a function of said sensor temperature and time according to a thermal model of the oscillator comprises the steps of:

(a) varying the ambient temperature and measuring temperature and oscillator frequency over time;

(b) calculating estimates of the sensor temperature from the temperature measurements using said calibration data of the temperature sensor;

(c) calculating estimates of the oscillator temperature from the sensor temperature estimates over time using the thermal model of the oscillator;

(d) calculating estimates of the oscillator frequency using the oscillator temperature estimates;

(e) observing errors between the oscillator frequency estimates and the oscillator frequency measurements;

(f) adjusting the parameters of the thermal model of the oscillator in order to reduce the errors, until said errors are acceptable; thereby calibrating the thermal model;

(g) calibrating the oscillator frequency as a function of the estimated oscillator temperature using the oscillator frequency measurements; thereby removing the effect of time variations and rates.

13. The method as claimed in claim 12, wherein the step of observing errors is performed by displaying the error versus a temperature estimate using a Lissajous plot, and estimating the size of the Lissajous pattern on the Lissajous plot.

* * * * *